United States Patent
Nakamura et al.

(10) Patent No.: US 7,108,810 B2
(45) Date of Patent: Sep. 19, 2006

(54) ANTI-REFLECTION FILM AND PROCESS FOR THE PREPARATION OF THE SAME

(75) Inventors: Kazuhiro Nakamura, Minami-ashigara (JP); Ichiro Amimori, Minami-ashigara (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 266 days.

(21) Appl. No.: 10/288,508

(22) Filed: Nov. 6, 2002

(65) Prior Publication Data

US 2003/0077437 A1   Apr. 24, 2003

Related U.S. Application Data

(62) Division of application No. 09/401,530, filed on Sep. 22, 1999, now abandoned.

(30) Foreign Application Priority Data

Sep. 22, 1998 (JP) .................. 10-268282
Mar. 17, 1999 (JP) .................. 11-071588

(51) Int. Cl.
    *B29D 11/00* (2006.01)
(52) U.S. Cl. .................. 264/1.7; 264/2.7; 264/284
(58) Field of Classification Search .............. 264/1.7, 264/2.7, 284
    See application file for complete search history.

(56) References Cited

U.S. PATENT DOCUMENTS

| | | |
|---|---|---|
| 5,198,267 A | 3/1993 | Aharoni et al. |
| 5,691,792 A | 11/1997 | Mizushima et al. |
| 5,742,118 A | 4/1998 | Endo et al. |
| 5,770,306 A | 6/1998 | Suzuki et al. |
| 5,817,421 A | 10/1998 | Oishi et al. |
| 5,820,957 A | 10/1998 | Schroeder et al. |
| 5,847,795 A | 12/1998 | Satoh et al. |
| 5,910,356 A | 6/1999 | Ishikawa et al. |
| 5,919,555 A | 7/1999 | Yasuda et al. |
| 5,945,209 A | 8/1999 | Okazaki et al. |
| 6,010,774 A | 1/2000 | Kadokura et al. |
| 6,064,524 A | 5/2000 | Oka et al. |
| 6,111,699 A | 8/2000 | Iwata et al. |
| 6,115,152 A | 9/2000 | Popovich et al. |
| 6,129,980 A | 10/2000 | Tsukada et al. |
| 6,157,504 A | 12/2000 | Yamada et al. |
| 6,166,855 A | 12/2000 | Ikeyama et al. |
| 6,261,665 B1 * | 7/2001 | Murata et al. ............... 428/143 |
| 6,849,327 B1 * | 2/2005 | Ikuhara et al. ............... 428/339 |

FOREIGN PATENT DOCUMENTS

| | | |
|---|---|---|
| EP | 778476 A2 | 6/1997 |
| EP | 827180 A1 | 3/1998 |

* cited by examiner

*Primary Examiner*—Mathieu D. Vargot
(74) *Attorney, Agent, or Firm*—Buchanan Ingersoll & Rooney PC

(57) ABSTRACT

An anti-reflection film comprises a transparent support and a low refractive index coating layer. The low refractive index coating layer has a refractive index lower than a refractive index of the support. The low refractive index coating layer has an essentially uniform thickness, while the layer has a surface roughness in terms of an arithmetic mean (Ra) in the range of 0.05 to 2 μm.

10 Claims, 2 Drawing Sheets

ANTI-REFLECTION FILM AND PROCESS FOR THE PREPARATION OF THE SAME

This application is a divisional of application Ser. No. 09/401,530, filed on Sep. 22, 1999 now abandoned.

FIELD OF THE INVENTION

The present invention relates to an anti-reflection film and a process for the preparation of the same.

BACKGROUND OF THE INVENTION

Anti-reflection films are used in various display devices such as a liquid crystal display device (LCD), a plasma display panel (PDP), an electroluminescence display (ELD), and a cathode-ray tube (CRT). Further, lenses of glasses or cameras generally have the Anti-reflection films.

As an anti-reflection film, a multi-layered film comprising plural transparent metal oxide layers superposed one on another has been widely employed. The plural transparent metal oxide layers lower reflections of light in a wide wavelength region. The layers are formed by chemical vapor deposition (CVD) process or physical vapor deposition (PVD) process (especially, vacuum deposition process).

On a support having a rough surface of anti-glare coating, an anti-reflection film is often formed by PVD process. This film reduces the transmittance of parallel rays as compared with a film provided on a smooth support. In spite of that, since the roughness on the support scatters light to prevent the film from reflecting the surrounding scene, a device equipped with that film can display a remarkably improved image.

Although the transparent metal oxide layers thus give an anti-reflection film having the excellent optical characteristics, the deposition process has insufficient productivity for mass-production.

In place of the deposition process, it is proposed to apply a coating liquid containing inorganic fine particles to prepare an anti-reflection film.

Japanese Patent Publication No. 60(1985)-59250 describes an anti-reflection film comprising fine holes and inorganic fine particles. The film is formed by applying a coating liquid, and the formed film is subjected to active gas treatment. Through the treatment, the gas escapes from the film to form the fine holes.

Japanese Patent Provisional Publication No. 59(1984)-50401 describes an anti-reflection film comprising a support, a high refractive index layer and a low refractive index layer superposed in this order. The publication also discloses an anti-reflection film further comprising a middle refractive index layer provided between the support and the high refractive index layer. In each film, the low refractive index layer is formed by applying a coating liquid containing a polymer or inorganic fine particles.

Japanese Patent Provisional Publication No. 2(1990)-245702 discloses an anti-reflection film comprising two or more kinds of micro particles (for example, $SiO_2$ and $MgF_2$). The mixing ratio of the particles varies in the thickness direction so that the refractive index may gradually vary along the thickness. The film having that structure has optical characteristics similar to those of the film in No. 59(1984)-50401, which comprises both high and low refractive index layers. In the film of No. 2(1990)-245702, the micro particles are combined with $SiO_2$ formed by thermal decomposition of ethyl silicate. In the thermal decomposition, the ethyl part of ethyl silicate is burnt to evolve carbon dioxide and water vapor. The produced carbon dioxide and water vapor escape from the film to form voids among the micro particles (as shown in FIG. 1 of the Publication).

Japanese Patent Provisional Publication No. 5(1993)-13021 discloses an anti-reflection film in which the voids described in No. 2(1990)-245702 are filled with a binder.

Japanese Patent Provisional Publication No. 7(1995)-48527 discloses an anti-reflection film containing a binder and inorganic fine particles of porous silica.

In order to reduce glare of a wet-type anti-reflection film, the above-described process in which the film is formed on a rough support and the process in which matting particles are added into the coating liquid were thus developed and proposed. However, in the former process, the coating liquid applied on convex parts of the rough surface flows into concave parts to form a layer having an uneven thickness. Consequently, the resulting film poorly reduces reflection as compared with a film formed on a smooth surface. On the other hand, in the latter, it is needed to incorporate the matting particles having sizes of about 1 μm or more into a thin film having a thickness of 0.1 to 0.3 μm, and accordingly the particles are apt to defect from the film. Therefore, an anti-reflection film having both sufficient film strength and satisfying anti-glare performance had been hardly produced by applying a coating liquid.

SUMMARY OF THE INVENTION

The present inventors have studied a low refractive index coating layer comprising inorganic fine particles. The study revealed that the refractive index of the layer can be lowered by micro voids contained therein. By piling up two or more inorganic fine particles in the layer, the micro voids can be formed among the particles. The voids remarkably decrease the refractive index of the layer. In the anti-reflection film disclosed in Japanese Patent Publication No. 2(1990)-245702, voids are formed among the fine particles. However, although the Publication suggests the voids among the particles in FIG. 1, it is silent on the optical characteristics of the voids. Further, a low refractive index layer containing the voids generally has insufficient mechanical strength. Since the low refractive index layer is often placed on the screen of image display device or the outer surface of lens, the layer needs to have enough strength. The film disclosed in Japanese Patent Publication No. 2(1990)-245702 substantially consists of only inorganic compounds, and hence it is hard but very fragile.

Japanese Patent Provisional Publication No. 5(1993)-13021 discloses an anti-reflection film in which the voids are filled with a binder. According to the study of the inventor, that film has sufficient strength, but the voids filled with the binder can not satisfyingly lower the refractive index of the layer.

The inventors have further studied the method for reducing glare of a wet-type anti-reflection film so that the film may not reflect the surrounding scene. According to the study, it is preferred to perform an anti-glare treatment after a film is formed from a coating liquid. In detail, the preferred method comprises the steps of forming the film by applying a coating liquid, and then roughening at least one surface of the transparent support by external force. The study of the inventor revealed that this method gives an anti-reflection film having both sufficient mechanical strength and excellent anti-glare performance.

An object of the present invention is to provide an anti-reflection film which comprises a low refractive index layer formed from a coating liquid and which has excellent anti-reflection and anti-glare performance comparable to that of the film comprising the layer formed by deposition process.

Another object of the invention is to provide a process for the preparation of an anti-reflection film, by which roughness comparable to that on the layer formed by deposition process can be given without impairing the anti-reflection performance onto the layer formed from a coating liquid.

The present invention provides an anti-reflection film comprising a transparent support and a low refractive index coating layer having a refractive index lower than a refractive index of the support, wherein the low refractive index coating layer has a surface roughness in terms of an arithmetic mean in the range of 0.05 to 2 µm, and wherein the low refractive index coating layer has an essentially uniform thickness.

The invention also provides a process for the preparation of an anti-reflection film comprising the steps of:

coating a coating solution on a transparent support to form a low refractive index layer; and then embossing the low refractive index layer to form a rough surface on the low refractive index layer.

The inventor had studied the method for forming the anti-glare roughness without using matting particles on the layer prepared from a coating liquid, and found that the roughness can be easily formed by embossing treatment without degrading the uniform thickness of the layer. Accordingly, although the anti-reflection film of the invention comprises a low refractive index layer formed from a coating liquid, it has excellent anti-reflection and anti-glare performance comparable to that of the film comprising the layer formed by deposition process.

The anti-reflection film of the invention can be easily produced by the process comprising the steps of applying a coating liquid and performing embossing treatment, and hence is suitable for mass-production in contrast to the film produced by deposition process.

The film of the invention effectively prevents the display screen from reflecting light and the surrounding scene.

DETAILED DESCRIPTION OF THE INVENTION

By referring to the attached drawings, basic composition of the anti-reflection film is explained below.

Anti-glare Treatment

Figure 1:
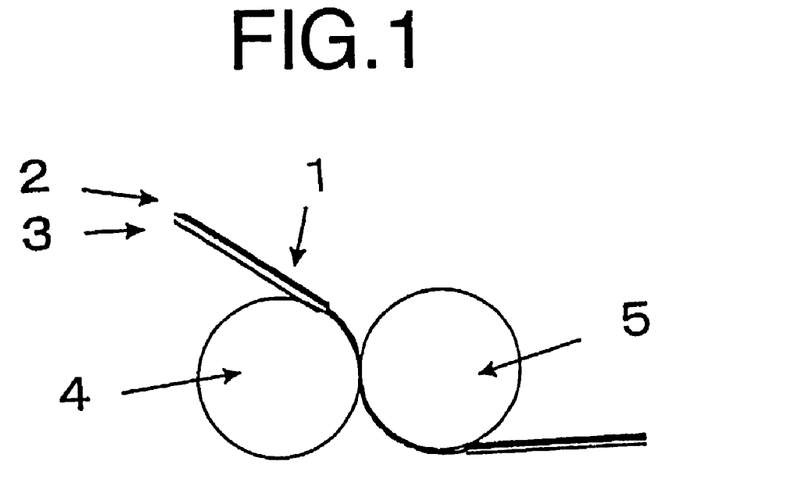
FIG. 1 is a sectional view schematically illustrating an anti-glare treatment for the anti-reflection film.

FIG. 1 shows an example of the anti-glare treatment for a wet-type anti-reflection film (i.e., a film formed from a coating liquid). In FIG. 1, an anti-reflection film (1) is pressed between an embossing roll (4) and a back-up roll (5) to roughen the surface on the anti-reflection layer (3) side. Thus, the anti-glare treatment can be carried out without harming the anti-reflection performance of the film.

With respect to the essentially uniform thickness of the layer, the allowance depends on the number of interference layers and design of the film. For example, if low, high and middle refractive index layers (each of which has the thickness of λ/4n) are superposed in this order from the free surface side (i.e., the side not faced to the support), the thickness of each layer has an allowance of ±3%. In that case, if the variation of the thickness is out of the allowance, the film exhibits remarkably impaired anti-reflection performance.

The anti-glare treatment can be controlled by various conditions such as temperature of the film in embossing process, pressure of pressing, processing rate, and material of the transparent support. Preferably, the treatment is carried out under mild conditions in consideration of cost, the uniform thickness of the layer, and stability of the procedures.

Surface Roughness

The surface roughness of the anti-reflection film can be evaluated in the following manner. The surface of the sample subjected to the anti-glare treatment is observed by means of a scanning microscope, and the obtained data are analyzed to evaluate the roughness.

According to JIS-B-0601, the arithmetic mean of roughness (Ra) is evaluated.

In the present invention, the anti-reflection film has a surface roughness in terms of an arithmetic mean (Ra) in the range of 0.05 to 2 µm, preferably 0.07 to 1.5 µm, more preferably 0.09 to 1.2 µm, and most preferably 0.1 to 1.0 µm.

The surface having an Ra of less than 0.05 µm can not satisfyingly reduces glare. If the Ra is above 2 µm the obtained image exhibits poor resolution or is often whitened by external light.

Further, the low refractive index coating layer preferably has such a rough surface that an area of a roughness curve having a period of 1 to 10 µm is more than 15% based on the total area of the rough surface. In other words, the surface preferably has the roughness strength having a pitch of 1 to 10 µm in a ratio of not less than 15% (more preferably not less than 20%, further preferably not less than 30%) based on the total surface roughness strength. The higher the ratio is, the better anti-glare performance the surface gives.

The ratio of the roughness strength having a pitch of 1 to 10 µm can be estimated from analysis of power spectral density (PSD), which is defined by the following formula (1):

$$PSD = \frac{1}{A}\left|\frac{\pi}{2}\int dx \int dy \cdot \exp\{i(px+qy)\}z(x,y)\right|^2 \quad (1)$$

in which A is a scanning range, each p and r is a horizontal frequency, and z(x, y) represents image data.

With respect to each of the total roughness strength and the roughness strength having a pitch of 1 to 10 µm, root mean square (RMS) is calculated according to the following formula (2):

$$RMS = \sqrt{\int PSD \, dp \, dq} \quad (2)$$

The ratio of the roughness strength having a pitch of 1 to 10 µm corresponds to the ratio of $RMS^{1-10}/RMS^{total}$ (in which $RMS^{1-10}$ and $RMS^{total}$ represent root mean squares of the roughness strength having a pitch of 1 to 10 µm and the total roughness strength, respectively).

The average pitch between a peak on the surface and a neighboring peak is preferably in the range of 10 to 60 µm, and more preferably in the range of 15 to 40 µm.

The average depth between the top of the surface curve and the bottom of the curve is preferably in the range of 0.05 to 2 μm, and more preferably in the range of 0.1 to 1 μm.

Preparation of Anti-reflection Film

Figure 2:
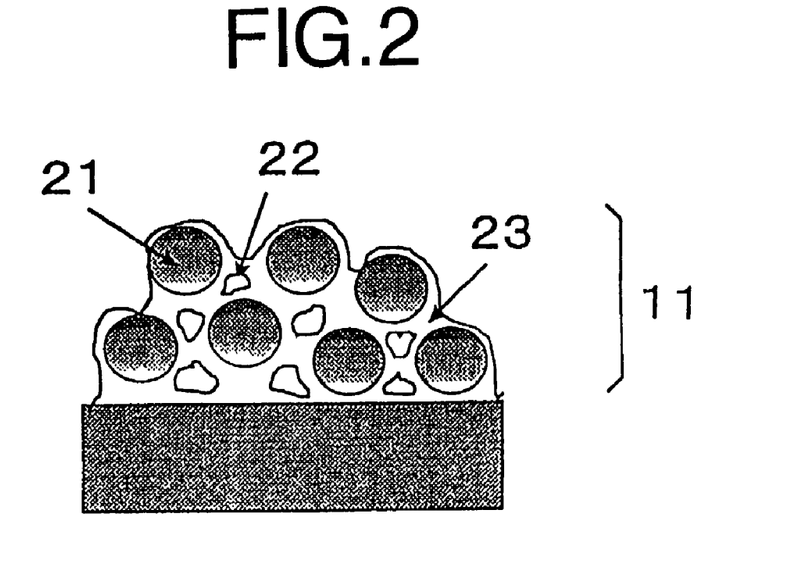
FIG. 2 schematically shows a cross-sectional view of an example of the low refractive index layer in the anti-reflection film.

FIG. 2 schematically shows a cross-sectional view of an example of the low refractive index layer. The upper surface of the low refractive index layer in FIG. 2 is the surface of the anti-reflection film A display device or a lens is placed below the layer of FIG. 2. The low refractive index layer (11) is porous. In the low refractive index layer (11), inorganic fine particles (21) having a mean particle size of 0.5 to 200 nm are piled up (three particles are piled up in FIG. 2). Among the inorganic fine particles (21), micro voids (22) are formed. The low refractive index layer (21) further contains polymer (23) in an amount of 5 to 50 wt. %. The polymer (23) binds the particles (21), but does not fill the micro voids (22).

Besides the porous layer (11) shown in FIG. 2, the low refractive index layer may be a layer comprising a fluorine-containing polymer. As the fluorine-containing polymer, polymers containing fluorine in a high content or having a large free volume are preferred in consideration of low refractive index. Further, in consideration of close contact, cross-linkable polymers are preferred. The cross-linkable polymers of thermosetting type or ionizing radiation curing type are commercially available.

Figure 3:
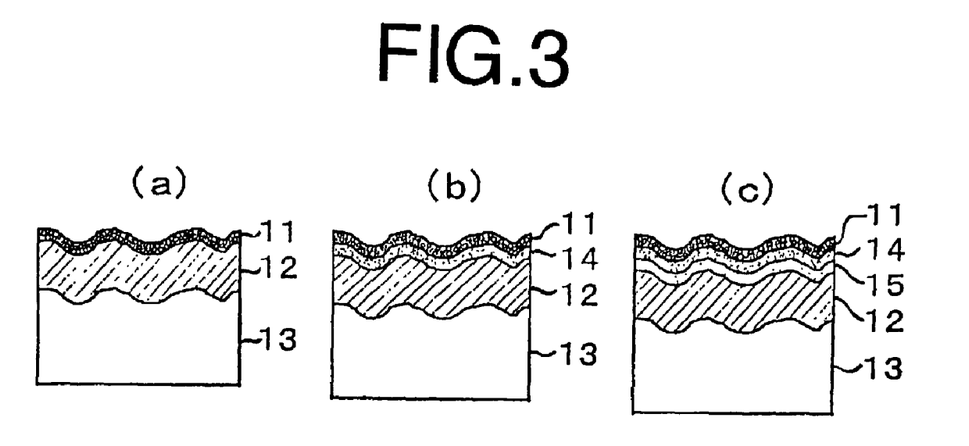
FIG. 3 shows various layered structures of the anti-reflection film.

FIG. 3 shows various layered structures of the anti-reflection film.

The embodiment shown in FIG. 3(a) comprises a transparent support (13), a hard coating layer (12), and a low refractive index layer (11) superposed in this order.

The transparent support (13) and the low refractive index layer (11) have the refractive indices satisfying the following formula:

$$Ri(L) < Ri(S)$$

in which Ri(L) means the refractive index of the low refractive index layer; and Ri(S) means the refractive index of the transparent support.

The embodiment shown in FIG. 3(b) comprises a transparent support (13), a hard coating layer (12), a high refractive index layer (14) and a low refractive index layer (11) superposed in this order.

The transparent support (13), the low refractive index layer (11) and the high refractive index layer (14) have the refractive indices satisfying the following formula:

$$Ri(L) < Ri(S) < Ri(H)$$

in which Ri(L) means the refractive index of the low refractive index layer; Ri(S) means the refractive index of the transparent support; and Ri(H) means the refractive index of the high refractive index layer.

The embodiment shown in FIG. 3 (c) comprises a transparent support (13), a hard coating layer (12), a middle refractive index layer (15), a high refractive index layer (14) and a low refractive index layer (11) superposed in this order.

The transparent support (13), the low refractive index layer (11), the high refractive index layer (14) and the middle refractive index layer have the refractive indices satisfying the following formula:

$$Ri(L) < Ri(S) < Ri(M) < Ri(H)$$

in which Ri(L) means the refractive index of the low refractive index layer; Ri(S) means the refractive index of the transparent support; Ri(M) means the refractive index of the middle refractive index layer; and Ri(H) means the refractive index of the high refractive index layer.

Transparent Support

A plastic film is preferably used as the transparent support.

Examples of the plastic materials for the support include cellulose esters (e.g., triacetyl cellulose, diacetyl cellulose, propionyl cellulose, butyryl cellulose, acetyl propionyl cellulose, and nitrocellulose), polyamides, poly-carbonates, polyesters (e.g., polyethylene terephthalate, polyethylene naphthalate, poly-1,4-cyclohexanedimethylene terephthalate, polyethylene-1,2-diphenoxyethane-4,4'-dicarboxylate, polybutylene terephthalate), polystyrene (e.g., syndiotactic polystyrene), polyolefins (e.g., polypropylene, polyethylene and polymethylpentene), polysulfone, polyethersulfone, polyarylate, polyether imide, polymethyl methacrylate, and polyether ketone. Triacetyl cellulose, polycarbonates, and polyethylene terephthalate are preferred.

The transparent support preferably has a percent transmission of not less than 80%, more preferably not less than 86%. The haze of the support is preferably in the range of not more than 2.0%, more preferably not more than 1.0%. The support preferably has a refractive index of 1.4 to 1.7.

(Low Refractive Index Layer)

The low refractive index layer has a refractive index preferably in the range of 1.20 to 1.55, and more preferably in the range of 1.30 to 1.55.

The low refractive index layer has a thickness preferably in the range of 50 to 400 nm, and more preferably in the range of 50 to 200 nm.

The low refractive index layer can be formed by using a fluorine compound having a low refractive index (1.38 to 1.49). The fluorine compound has a coefficient of kinetic friction preferably in the range of 0.03 to 0.05. The fluorine compound has a contact angle to water preferably in the range of 90 to 1200. The fluorine compound preferably is cross-linkable, and more preferably is cross-linked by heat or electrolytic irradiation. The fluorine compound can be used in combination with another compound. The cross-linkable fluorine compound includes a fluorine monomer and a cross-linkable fluorine polymer. The cross-linkable fluorine polymer is preferably used to form the low refractive index layer.

The cross-linkable fluorine polymer preferably is a silane compound,containing a perfluoroalkyl group (e.g., heptadecafluoro-1,1,2,2-tetradecyl)triethoxysilane). The cross-linkable fluorine polymer can also be obtained by copolymerizing a fluorine monomer and a cross-linkable monomer.

Examples of the fluorine monomers include fluoroolefins (e.g., fluoroethylene, vinylidene fluoride, tetrafluoroethylene, hexafluoroethylene, hexafluoropropylene, perfluoro-2, 2-dimethyl-1,3-dioxol), a partially or totally fluorine-substituted alkyl ester of (meth)acrylic acid and a prettily or totally fluorine-substituted vinyl ether. The partially or totally fluorine-substituted alkyl ester of (meth)acrylic acid is commercially available (e.g., Viscote 6FM, Osaka Organic Chemicals Inc.; M-2020, Daikin Co., Ltd.).

The cross-linkable monomer preferably is a (meth)acrylic ester monomer having a cross-linkable group (e.g., glycidyl acrylate). A meth(acrylate) monomer having carboxyl, hydroxyl, amino or sulfo (e.g., (meth)acrylic acid, methylol (meth)acrylate, hydroxylalkyl (meth)acrylate, allyl acrylate) can also be used as the cross-linkable monomer. After polymerization of the monomer, a cross-linking structure can be introduced into carboxyl, hydroxyl, amino or sulfo (as is described in Japanese Patent Provisional Publication Nos. 10(1998)-25388 and 10(1998)-147739).

The fluorine monomer can be copolymerized with another monomer containing no fluorine atom. Examples of the monomers containing no fluorine atom include olefins (e.g., ethylene, propylene, isoprene, vinyl chloride, vinylidene chloride), acrylic esters (e.g., methyl acrylate, ethyl acrylate, 2-ethylhexyl acrylate), methacrylic esters (e.g., methyl methacrylate, ethyl methacrylate, butyl methacrylate, ethylene glycol dimethacrylate), styrene, styrene derivatives (e.g., divinylbenzene, vinyltoluene, α-methyl-styrene), vinyl ethers (e.g., methyl vinyl ether), vinyl esters (e.g., vinyl acetate, vinyl propionate, vinyl cinnamate), acrylamides (e.g., N-tert-butylacrylamide, N-cyclo-hexylacrylamide), methacrylamides and acrylonitrile derivatives.

The low refractive index layer can also be formed by using micro particles and a polymer to form micro void structure in the layer.

The micro particles have a mean particle size preferably in the range of 10 to 200 nm, more preferably in the range of 10 to 100 nm, further preferably in the range of 10 to 70 nm, and most preferably in the range of 10 to 40 nm.

The amount of the micro particles is preferably in the range of 50 to 95 wt. %, more preferably in the range of 50 to 90 wt. %, and most preferably in the range of 50 to 80 wt. % based on the total amount of the low refractive index layer.

The micro particles preferably are inorganic particles. Inorganic particles are preferably made of a metal oxide, a metal nitride, a metal sulfide or a metal halide, more preferably made of a metal oxide or a metal halide, and most preferably made of a metal oxide or a metal fluoride. The metal atom preferably is Na, K, Mg, Ca, Ba, Al, Zn, Fe, Cu, Ti, Sn, In, W, Y, Sb, Mn, Ga, V, Nb, Ta, Ag, Si, B, Bi, Mo, Ce, Cd, Be, Pb or Ni, and more preferably is Mg, Ca, B or Si. The inorganic particles can be made of an inorganic substance containing two or more metal atoms.

The inorganic particles are most preferably made of a fluoride of an alkali metal (e.g., NaF, KF), a fluoride of an alkaline earth metal (e.g., $CaF_2$, $MgF_2$) or silicon dioxide ($SiO_2$).

The inorganic particles are preferably amorphous (not crystallized).

A dispersion of inorganic particles can be prepared by a sol-gel method (described in Japanese Patent Provisional Publication No. 53(1978)-112732, Japanese Patent Publication No. 57(1982)-9051) or a precipitation method (described in APPLIED OPTICS, 27, page 3356 (1988)). Further, powder of inorganic particles prepared by a drying and sedimentation method can be mechanically crushed to prepare a dispersion. Some inorganic particles (e.g., silicon dioxide sol) are commercially available.

The inorganic particles are preferably used in the form of a dispersion in an appropriate medium to form a low refractive index layer. Examples of the mediums include water, alcohols (e.g., methanol, ethanol, isopropyl alcohol) and ketones (e.g., methyl ethyl ketone, methyl isobutyl ketone).

In the low refractive index layer, the content of micro voids generally is in the range of 0.05 to 0.50 volume fraction, preferably is in the range of 0.10 to 0.50 volume fraction, especially in the range of 0.10 to 0.28 volume fraction.

In the case that particles having monodispersed particle size are made closest packing, micro voids formed by the surrounding particles are 26% (0.26 volume fraction). Further, when the particles are made simple cubic packing, micro voids formed by the surrounding particles are 48% (0.48 volume fraction). In the practical system (i.e., the low refractive index layer), the particles have distribution range of particle size although the range is narrow and therefore the volume fraction of micro voids of the low refractive index layer shows somewhat different value from the above value. Further, the volume fraction of micro voids varies depending upon methods or conditions for forming the low refractive index layer (i.e., for bonding the particles).

When the volume fraction of micro voids is too high, mechanical strength of the low refractive index layer is lowered. Therefore, the volume fraction of micro voids of the low refractive index layer generally is not more than 0.50 volume fraction as mentioned above. In the case that a small amount of binder is employed, the volume fraction of micro voids varies depending on the ratio of the particles and the binder. Provided the micro voids formed between the particles have size of decades nm to several hundred nm (i.e., size of not larger than wavelength of light), a transparent layer having the aimed refractive index can be formed by selecting material in terms of refractive index and by adjusting the content of micro voids in the layer.

The particles are preferably subjected to a surface treatment to improve an affinity with a polymer binder. The surface treatment is classified into a physical treatment (e.g., plasma discharge treatment, corona discharge treatment) and a chemical treatment using a coupling agent. The particles are preferably subjected to a chemical treatment only, or to a combination of chemical and physical treatments.

The coupling agent preferably is an organoalkoxy metal compound (e.g., titanium coupling agent, silane coupling agent). In the case that particles are made of silicon dioxide, a surface treatment using a silane coupling agent is particularly effective.

A preferred silane coupling agent is represented by the following formula (Ia) or (Ib).

wherein each of $R^1$, $R^5$ and $R^6$ independently is an alkyl group having 1 to 10 carbon atoms, an aryl group having 1 to 10 carbon atoms, an alkenyl group having 2 to 10 carbon atoms, an alkynyl group having 2 to 10 carbon atoms or an aralkyl group having 7 to 10 carbon atoms, and each of $R^2$, $R^3$, $R^4$, $R^7$ and $R^8$ independently is an alkyl group having 1 to 6 carbon atoms or an acyl group having 2 to 6 carbon atoms.

In the formula (Ia) or (Ib), each of $R^1$, $R^5$ and $R^6$ preferably is an alkyl group, an aryl group, an alkenyl group or an aralkyl group, more preferably is an alkyl group, an aryl group or an alkenyl group, and most preferably is an alkyl group or an alkenyl group. The alkyl group, the aryl group, the alkenyl group, the alkynyl group and the aralkyl group may have a substituent group. Examples of the substituent groups include glycidyl, glycidyloxy, an alkoxy group, a halogen atom, an acyloxy group (e.g., acryloyloxy, methacryloyloxy), mercapto, amino, carboxyl, cyano, isocyanato and an alkenylsulfonyl group (e.g., vinylsulfonyl).

In the formula (Ia) or (Ib), each of $R^2$, $R^3$, $R^4$, $R^7$ and $R^8$ preferably is an alkyl group. The alkyl group may have a substituent group. Examples of the substituent groups include an alkoxy group.

The silane coupling agent preferably has a double bond in its molecule, which can be combined with a polymer binder by a reaction of the double bond. The double bond is preferably contained in $R^1$, $R^5$ or $R^6$ in the formula (Ia) or (Ib).

A more preferred silane coupling agent is represented by the following formula (IIa) or (IIb).

wherein each of $R^{11}$ and $R^{15}$ independently is hydrogen or methyl, $R^{16}$ is an alkyl group having 1 to 10 carbon atoms, an aryl group having 1 to 10 carbon atoms, an alkenyl group having 2 to 10 carbon atoms, an alkynyl group having 2 to 10 carbon atoms or an aralkyl group having 7 to 10 carbon atoms, and each of $R^{12}$, $R^{13}$, $R^{14}$, $R^{17}$ and $R^{18}$ independently is an alkyl group having 1 to 6 carbon atoms or an acyl group having 2 to 6 carbon atoms.

In the formula (IIb), $R^{12}$, $R^{13}$, $R^{14}$, $R^{17}$ and $R^{18}$ have the same meanings as for $R^2$, $R^3$, $R^4$, $R^7$ and $R^8$ in the formula (Ia) or (Ib).

In the formula (IIa) or (IIb), $R^{16}$ has the same meanings as for $R^1$, $R^5$ and $R^6$ in the formula (Ia) or (Ib). is an alkyl group having 1 to 6 carbon atoms or an acyl group having 2 to 6 carbon atoms.

Examples of the silane coupling agents represented by the formula (Ia) include methyltrimethoxysilane, methyltriethoxysilane, methyltrimethoxyethoxysilane, methyltriacetoxysilane, methyltributoxysilane, ethyltrimethoxysilane, ethyltriethoxysilane, vinyltrimethoxysilane, vinyltriethoxysilane, vinyltriacetoxysilane, vinyltrimethoxyethoxysilane, phenyltrimethoxysilane, phenyltriethoxysilane, phenyltriacetoxysilane, γ-chloro-propyltrimethoxysilane, γ-chloropropyltriethoxysilane, γ-chloropropyltriacetoxysilane, 3,3,3-trifluoropropyltrimethoxysilane, γ-glycidyloxypropyltrimethoxysilane, γ-glycidyloxypropyltriethoxysilane, γ-(β-glycidyloxy-ethoxy)propyltrimethoxysilane, β-(3,4-epoxycylo-hexyl)ethyltrimethoxysilane, β-(3,4)-epoxycyclo-hexyl)ethyltriethoxysilane, γ-acryloyloxypropyltriemthoxysilane, γ-methacryloyloxypropyltrimethoxysilane, γ-amino-propyltrimethoxysilane, γ-aminopropyltriethoxysilane, γ-mercaptopropyltrimethoxysilane, γ-mercaptopropyltriethoxy-silane, N-β-(aminoethyl-γ-aminopropyltrimethoxysilane and β-cyanoethyltriethoxysilane.

Silane coupling agents having a double bond in its molecule such as vinyltrimethoxysilane, vinyltriethoxysilane, vinyltriacetoxysilane, vinyltrimethoxyethoxysilane, γ-acryloyloxypropyltrimethoxysilane and γ-methacryloyloxy-propyltrimethoxysilane are preferred. Silane coupling agents represented by the formula (IIa) such as γ-acryloyl-oxypropyltrimethoxysilane and γ-methacryloyloxypropyltrimethoxysilane are more preferred.

Examples of the silane coupling agents represented by the formula (Ib) include dimethyldimethoxysilane, phenyl-methyldimethoxysilane, dimethyldiethoxysilane, phenyl-methyldiethoxysilane, γ-glycidyloxypropylmethyldiethoxysilane, γ-glycidyloxypropylmethyldimethoxysilane, γ-glycidyl-oxypropylphenyldiethoxysilane, γ-chloropropylmethyldiethoxysilane, dimethyldiacetoxysilane, γ-acryloyloxypropylmethyldimethoxysilane, γ-acryloyloxypropylmethyl-diethoxysilane, γ-methacryloyloxypropylmethyldiethoxysilane, γ-methacryloyloxypropylmethyldimethoxysilane, γ-mercaptopropylmethyldimethoxysilane, γ-mercaptopropylmethyldiethoxysilane, γ-aminopropylmethyldimethoxysilane, γ-aminopropylmethyldiethoxysilane, methylvinyldimethoxysilane and methylvinyldiethoxysilane.

Silane coupling agents having a double bond in its molecule such as γ-acryloyloxypropylmethyldimethoxysilane, γ-acryloyloxypropylmethyldiethoxysilane, γ-methacryloyloxy-propylmethyldiethoxysilane, γ-methacryloyloxypropylmethyl-dimethoxysilane, methylvinyldimethoxysilane and methylvinyldiethoxysilane are preferred. Silane coupling agents represented by the formula (IIb) such as γ-acryloyloxypropylmethyldimethoxysilane, γ-acryloyloxypropylmethyldiethoxysilane, γ-methacryloyloxypropylmethyl-diethoxysilane and γ-methacryloyloxypropylmethyldimethoxysilane are more preferred.

Two or more silane coupling agents can be used in combination.

Another silane coupling agent can be used in combination with the silane coupling agent represented by the formula (Ia) or (Ib). Examples of the other coupling agents include an alkyl orthosilicate (e.g., methyl orthosilicate, ethyl orthosilicate, n-propyl orthosilicate; i-propyl orthosilicate, n-butyl orthosilicate, sec-butyl orthosilicate, t-butyl orthosilicate) and a hydrolyzed product thereof.

The surface treatment using a coupling agent can be conducted by adding the coupling agent to a dispersion of particles, and leaving the mixture at the room temperature to 60° C. for several hours to 10 days. An inorganic acid (e.g., sulfuric aci d, hydrochloric acid, nitric acid, chromic acid, hypochlorous acid, boric acid, orthosilicic acid, phosphoric acid, carbonic acid), an organic acid (e.g., acetic acid, polyacrylic acid, benzenesulfonic acid, phenol, polyglutamic acid), or a salt thereof (e.g., metal salt, ammonium salt) can be added to the dispersion to accelerate the reaction of the surface treatment.

The binder is needed to be used so as not to fill up the micro voids. Examples of binder include water-soluble resins such as polyvinyl alcohol and polyoxyethylene; acrylic resins such as polymethyl acrylate and polymethyl acrylate; and cellulose derivatives such as nitrocellulose. In the case that the particles are dispersed in water, the water-soluble resins are employed as the binder. In the case that the particles are dispersed in organic solvent, preferred are resins (i.e., the above acrylic resins and cellulose derivatives) which can be soluble in the organic solvent and which has a strong affinity with the particles or the transparent film and a high transparency. Further, in the case that a polymerizable binder is employed as a binder for particles, the resultant layer of particles can be cross-linked by ultraviolet radiation or heating.

The polymerizable binder is preferably cross-linked. The cross-linked binder polymer can be synthesized by using a monomer having two or more ethylenically unsaturated groups.

Examples of the monomers include esters of polyhydric alcohol with (meth)acrylic acids (e.g., ethyleneglycol di(meth)acrylate, 1,4-dicyclohexane diacrylate, pentaerythrytol tetra(meth)acrylate, pentaerythrytol tri(meth)acrylate, trimethylolpropane tri(meth)acrylate, trimethylolethane tri(meth)acrylate, dipentaerythrytol penta(meth)acrylate, dipentaerythrytol hexa(meth)acrylate, 1,2,3-cyclohexane tetramethacrylate, polyurethane polyacrylate, polyester polyacrylate), vinyl benzene and its derivatives (e.g., 1,4-divinylbenzene, 2-acryloylethyl 4-vinylbenzoate, 1,4-divinylcyclohexanone), vinylsulfones (e.g., divinylsulfone) and acrylamides (e.g., methylenebisacrylamide) and methacrylamides.

The binder polymer is preferably synthesized by adding a monomer to a coating solution of the low refractive index layer and causing a polymerization reaction (if necessary and a cross-linking reaction) simultaneously with or after coating the solution. Examples of the polymerization initiators are the same as the initiators used in the synthesis of the shell polymer.

Two or more binder polymers can be used in combination.

The binder is generally employed in the minimum amount for enabling the bonding between the particles. The binder is preferably used in the amount of 5 to 25 weight % based on the total amount of the low refractive index layer.

(High and Middle Refractive Index Layers)

As shown in FIG. 3(b), a high refractive index layer may be provided between the transparent support and the low refractive index layer. Further, as shown in FIG. 3(c), a middle refractive index layer may be provided between the high refractive index layer and the transparent support. The refractive index of the high refractive index layer is preferably in the range of 1.65 to 2.40, more preferably 1.70 to 2.20. The refractive index of the middle refractive index layer is adjusted to a value between those of the high and low refractive index layers, and is preferably in the range of 1.55 to 1.80.

The high and middle refractive index layers are preferably formed with a polymer having a relatively high refractive index. Examples of the polymer having a high refractive index include polystyrene, styrene copolymer, polycarbonate, melamine resin, phenol resin, epoxy resin, and polyurethane derived from the reaction between cyclic (alicyclic or aromatic) isocyanate and polyol. Further, other polymers having cyclic (aromatic, heterocyclic, or alicyclic) groups and polymers substituted with a halogen atom except fluorine also have high refractive indexes. The polymer may be prepared by polymerization of monomers having double bonds for radical hardening.

Inorganic fine particles having high refractive indexes are preferably dispersed in the above-described polymers or in monomers and initiators usable for preparing the low refractive index layer. As the material for the particles, metal oxides (e.g., oxides of aluminum, titanium, zirconium, antimony) are preferably employed. If the particles are dispersed in the monomer and the initiator, a mixture of them is applied and polymerized to harden with ionizing radiation or heat to prepare a high or middle refractive index layer having excellent scratch resistance and strong adhesion.

The high and middle refractive index layers may contain silicon compounds substituted with organic groups. As the silicon compounds, silane coupling agents and their hydrolyzed products are preferably employed.

As the material of the inorganic fine particles, metal oxides (e.g., oxides of aluminum, titanium, zirconium, antimony) are preferred. Powder or colloidal dispersion of the particles is mixed with the polymer or the organic silicon compounds.

The inorganic fine particles preferably have a mean particle size of 10 to 100 nm. The high and middle refractive index layers may be formed from film-forming organometallic compounds. Preferably, the organometallic compounds are liquids or can be dispersed in a proper medium.

The hazes of the high and middle refractive index layers are preferably not more than 3%.

Besides the aforementioned layers, the anti-reflection film may have other layers such as a hard coating layer, a moisture proof layer, an antistatic layer, an undercoating layer, and a protective layer.

The hard coating layer gives scratch resistance to the transparent support, and further enhances adhesion between the support and the layer provided thereon. The hard coating layer can be formed with acrylic polymers, urethane polymers, epoxy polymers, and silica compounds. Pigments may be added to the hard coating layer.

The material for the hard coating layer is preferably a polymer having a main chain of saturated hydrocarbon or polyether (more preferably, saturated hydrocarbon). Further preferably, the polymer is cross-linked. The polymer having a main chain of saturated hydrocarbon is preferably prepared by polymerization of ethylenic unsaturated monomers. For preparing a cross-linked polymer, monomers having two or more ethylenic unsaturated groups are preferably used.

Examples of the monomer having two or more ethylenic unsaturated groups include: esters between polyhydric alcohols and (meth)acrylic acid (e.g., ethyleneglycol di(meth)acrylate, 1,4-cyclohexane diacrylate, pentaerythritol tetra(meth)acrylate, pentaerythritol tri(meth)acrylate, trimethylolpropane tri(meth)acrylate, trimethylolethane tri(meth)acrylate, dipentaerythrytol tetra(meth)acrylate, dipentaerythrytol penta(meth)acrylate, pentaerythritol hexa(meth)acrylate, 1,2,3-cyclohexanetetramethacrylate, polyurethane polyacrylate, polyester polyacrylate), vinyl-benzene and its derivatives (e.g., 1,4-divinylbenzene, 4-vinylbenzoic acid-2-acryloylethyl ester, 1,4-divinylcyclo-hexanone), vinylsulfones (e.g., divinylsulfone), acryl-amides (e.g., methylene bisacrylamide), and methacrylamide.

In place of or in addition to the monomer having two or more ethylenic unsaturated groups, cross-linking groups may be introduced to form a cross-linked structure. Examples of the cross-linking functional group include isocyanato group, epoxy group, aziridine group, oxazoline group, aldehyde group, carbonyl group, hydrazianoacrylate derivatives, melamine, etherized methylol, esters and urethane. The functional groups, such as block isocyanate group, decomposed to form the cross-linked structure are also usable.

The "cross-linking group" in the invention are not restricted by the aforementioned compounds, and include the groups decomposed to be active.

The hard coating layer is preferably formed by the steps of dissolving monomers and an initiator in a solvent, applying the prepared liquid, and polymerizing (and if desired, cross-linking) the applied liquid. Preferably, the initiator (e.g., benzophenones, acetophenones, triazines) is, singly or in combination of some kinds, added into the coating liquid together with the monomers.

In the coating liquid for the hard coating layer, a small amount of polymer (such as polymethylmethacrylate, polymethylacrylate, diacetylcellulose, triacetylcellulose, nitrocellulose, polyester, alkyd resin) may be added.

A protective layer may be provided on the low refractive index layer. The protective layer also serves as a slippery layer or a anti-stain layer.

Examples of slipping agents for the slippery layer include polyorganosiloxanes (e.g., polydimethylsiloxane, polydiethylsiloxane, polydiphenylsiloxane, polymethyl-phenylsiloxane, alkyl-modified polydimethylsiloxane), natural waxes (e.g., carnauba wax, candelilla wax, jojoba oil, rice wax, Japan wax, bees wax, hydrous lanolin, spermaceti, montan wax), petroleum waxes (e.g., paraffin wax, micro-crystalline wax), synthetic waxes (e.g., polyethylene wax, Fischer-Tropsch wax), higher fatty acid amides (e.g., stearamide, oleic amide, N,N'-methylenebisstearamide), higher fatty acid esters (e.g., methyl stearate, butyl stearate, glycerin monostearate, sorbitan monooleate), higher fatty acid metal salts (e.g., zinc stearate), and polymers containing fluorine (e.g., perfluoropolyether having a perfluoro main chain, perfluoropolyether having a perfluoro side chain, perfluoropolyether modified with alcohol, perfluoropolyether modified with isocyanate).

The anti-stain layer contains hydrophobic compounds containing fluorine (e.g., polymer containing fluorine, surface active agent containing fluorine, oil containing fluorine).

The protective layer has a thickness of not more than 20 nm, so as not to affect the performance of anti-reflection.

Each layer of the anti-reflection film can be formed by dip coating, air knife coating, curtain coating, roller coating, wire bar coating, gravure coating, and extrusion coating (described in U.S. Pat. No. 2,681,294). Two or more layers may be simultaneously formed by coating. The method for simultaneous coating is described in U.S. Pat. Nos. 2,761,791, No. 2,941,898, No. 3,508,947, and No. 3,526,528; and "Coating Engineering" pp.253, written by Y. Harazaki, published by Asakura Shoten (1973).

The anti-reflection film of the invention can be applied on a display device such as a liquid crystal display (LCD), a plasma display (PDP), an electroluminescence display (ELD) or a cathode ray tube display (CRT). If the film has a transparent support, the film is placed on the device so that the support may be attached to the display surface.

EXAMPLE 1

(Formation of Hard Coating Layer)

250 g of a mixture of dipentaerythritol pentaacrylate and dipentaerythritol hexaacrylate (DPHA, Nippon Kayaku Co., Ltd.) was dissolved in 439 g of industrial denatured ethanol. To the obtained solution, a solution prepared by dissolving 7.5 g of a photopolymerization initiator (Irgacure 907, Ciba-Geigy) and 5.0 g of a photosensitizer (Kayacure DETX, Nippon Kayaku Co., Ltd.) in 49 g of methyl ethyl ketone was added. After stirring, the mixture was filtered through 1 μm mesh to prepare a coating liquid for hard coating layer.

On a triacetylcellulose film (TAC-TD80U, Fuji Photo Film Co., Ltd.) having 80 μm thickness, a gelatin undercoating layer was provided. The coating liquid for hard coating layer was applied on the undercoating layer with a bar coater, dried at 120° C., and irradiated with UV light to harden. Thus, a hard coating layer having 6 μm thickness was formed.

(Preparation of Coating Liquid for Low Refractive Index Layer)

200 g of methanol dispersion of fine silica particles (methanol silica sol, Nissan Kagaku Co., Ltd.), 10 g of silane coupling agent (KBN-803, Shin-Etsu Silicon Co., Ltd.) and 2 g of 0.1 N hydrochloric acid were mixed and stirred at room temperature for 5 hours, and then stored at room temperature for about 4 days. Thus, a dispersion of fine silica particles subjected to silane treatment was prepared.

To 149 g of the dispersion, 789 g of isopropyl alcohol and 450 g of methanol were added. To the obtained mixture, a solution prepared by dissolving 3.21 g of a photopolymerization initiator (Irgacure 907, Ciba-Geigy) and 1.605 g of a photosensitizer (Kayacure DETX, Nippon Kayaku Co., Ltd.) in 31.62 g of isopropyl alcohol was added. Further, a solution prepared by dissolving 2.17 g of a mixture of dipentaerythritol pentaacrylate and dipentaerythritol hexaacrylate (DPHA, Nippon Kayaku Co., Ltd.) in 78.13 g of isopropyl alcohol was added. The thus prepared mixture was stirred at room temperature for 20 minutes, and filtered through 1 μm mesh to prepare a coating liquid for low refractive index layer.

(Production of Anti-reflection Film)

The coating liquid for low refractive index layer was applied on the hard coating layer with a bar coater, dried at 120° C., and irradiated with UV light to form a low refractive index layer (thickness: 0.1 μm). Thus, an anti-reflection film was produced.

(Anti-glare Treatment)

The prepared film was subjected to anti-glare treatment by means of a one-face embossing calender machine (Yuri-Roll Co., Ltd.) equipped with a steel embossing roll and a back-up roll covered with polyamide. The treatment conditions were as follows: pressing pressure: 1,000 kg/cm, preheat temperature of the rolls: 100° C., temperature of the embossing roll: 140° C., and processing rate: 2 m/minute. The embossing roll had an arithmetic mean of roughness (Ra) of 4 μm.

The average reflectance (in the wavelength region of 450 to 650 nm), the haze, and the surface mechanical strength (in terms of pencil grades) of the prepared film were measured, and found 1.0%, 1.5%, and H, respectively.

Further, the surface roughness (Ra) and the ratio of the roughness strength having a pitch of 1 to 10 μm were measured by means of a scanning probe microscope, and found 0.10 μm and 23%, respectively.

EXAMPLE 2

Preparation of Titanium Dioxide Dispersion)

30 weight parts of titanium dioxide (weight mean particle size of primary particles: 50 nm, refractive index: 2.70), 3 weight parts of the following anionic monomer (1), 3 weight parts of the following anionic monomer (2), 1 weight part of the following cationic monomer and 63 weight parts of methyl ethyl ketone were mixed by means of a sand grinder to prepare a dispersion of titanium dioxide.

Anionic monomer (1)

Anionic monomer (2)

Cationic monomer (Preparation of Coating Liquid for Middle Refractive Index Layer)

0.18 g of a photopolymerization initiator (Irgacure 907, Ciba-Geigy) and 0.059 g of a photosensitizer (Kayacure DETX, Nippon Kayaku Co., Ltd.) were dissolved in 172 g of cyclohexanone and 43 g of methyl ethyl ketone. To the obtained solution, a mixture of 15.8 g of the titanium dioxide dispersion and 3.1 g of a mixture of dipentaerythritol pentaacrylate and dipentaerythritol hexaacrylate (DPHA, Nippon Kayaku Co., Ltd.) were added and stirred at room temperature for 30 minutes. The liquid was filtered through 1 μm mesh to prepare a coating liquid for middle refractive index layer.

(Preparation of Coating Liquid for High Refractive Index Layer )

0.085 g of a photopolymerization initiator (Irgacure 907, Ciba-Geigy) and 0.028 g of a photosensitizer (Kayacure DETX, Nippon Kayaku Co., Ltd.) were dissolved in 183 g of cyclohexanone and 46 g of methyl ethyl ketone. To the obtained solution, 17.9 g of the titanium dioxide dispersion and 1.0 g of a mixture of dipentaerythritol pentaacrylate and dipentaerythritol hexaacrylate (DPHA, Nippon Kayaku Co., Ltd.) were added and stirred at room temperature for 30 minutes. The liquid was filtered through 1 μm mesh to prepare a coating liquid for high refractive index layer.

(Production of Anti-reflection Film)

The coating liquid for middle refractive index layer was applied on the hard coating layer formed in Example 1 with a bar coater, dried at 120° C., and irradiated with UV light to form a middle refractive index layer (thickness: 0.081 μm).

The coating liquid for high refractive index layer was applied on the middle refractive index layer with a bar coater, dried at 120° C., and irradiated with UV light to form a high refractive index layer (thickness: 0.053 μm).

The coating liquid for low refractive index layer of Example 1 was applied on the high refractive index layer with a bar coater, dried at 120° C., and irradiated with UV light to form a low refractive index layer (thickness: 0.092 μm).

The thus obtained anti-reflection film was subjected to the embossing process of anti-glare treatment described in Example 1.

The average reflectance (in the wavelength region of 450 to 650 nm), the haze, and the surface mechanical strength (in terms of pencil grades) of the prepared film were measured, and found 0.24%, 2.0%, and 2H, respectively. The film less reflected the surrounding scene.

Further, the surface roughness (Ra) and the ratio of the roughness strength having a pitch of 1 to 10 μm were measured by means of a scanning probe microscope, and found 0.09 μm and 25%, respectively.

EXAMPLE 3

The procedure of Example 1 was repeated except that a coating liquid prepared by diluting 100 g of thermo-crosslinkable polymer containing fluorine (Opstar JN-7214, Nippon Goseo Gomu Co., Ltd.) with 18 g of methyl ethyl ketone was used, to produce an anti-reflection film.

The average reflectance (in the wavelength region of 450 to 650 nm), the haze, and the surface mechanical strength (in terms of pencil grades) of the prepared film were measured, and found 1.0%, 1.5%, and H, respectively.

Further, the surface roughness (Ra) and the ratio of the roughness strength having a pitch of 1 to 10 μm were measured by means of a scanning probe microscope, and found 0.10 μm and 23%, respectively.

EXAMPLE 4

The anti-reflection film prepared in Example 2 was fixed on the liquid crystal display screen of personal computer (PC9821NS/340W, Nippon Electric Co., Ltd.). The image displayed on the screen equipped with the film was observed to confirm that surrounding scene was scarcely reflected in the screen, and that the film gave excellent viewability.

COMPARISON EXAMPLE 1

The procedure of Example 1 was repeated except that 5.0 g of crosslinked PMMA particles (MX-500, Sogo-Kagaku Co., Ltd.) having the mean particle size of 3 μm were added to the coating liquid for the hard coating layer. Thus, an anti-reflection film comprising a support, a hard coating layer containing the matting particles, and a low refractive index layer was prepared.

The surface roughness (Ra) and the ratio of the roughness strength having a pitch of 1 to 10 μm of the prepared film were 0.20 μm and 12%, respectively.

The average reflectance (in the wavelength region of 450 to 650 nm) was 2.0%, which means that the film can not fully prevent reflection.

COMPARISON EXAMPLE 2

The procedure of Example 2 was repeated except that 5.0 g of crosslinked PMMA particles (MX-500, Sogo-Kagaku Co., Ltd.) having the mean particle size of 3 μm were added to the coating liquid for the hard coating layer. Thus, an anti-reflection film comprising a support, a hard coating layer containing the matting particles, and a low refractive index layer was prepared.

The surface roughness (Ra) and the ratio of the roughness strength having a pitch of 1 to 10 μm of the prepared film were 0.20 μm and 12%, respectively.

The average reflectance (in the wavelength region of 450 to 650 nm) was 1.5%, which means that the film can not fully prevent reflection.

EXAMPLE 5

The anti-reflection film prepared in Example 1 (before The embossing process) was subjected to anti-glare treatment by means of a one-face embossing calender machine (Yuri-Roll Co., Ltd.) equipped with a steel embossing roll and a back-up roll covered with polyamide. The treatment conditions were as follows: pressing pressure: 600 kg/cm, preheat temperature of the rolls: 120° C., temperature of the embossing roll: 120° C., and processing rate: 2 m/minute. The embossing roll had an arithmetic mean of roughness (Ra) of 4 μm.

The average reflectance (in the wavelength region of 450 to 650 nm), the haze, and the surface mechanical strength (in terms of pencil grades) of the prepared film were measured, and found 1.0%, 1.5%, and H, respectively.

Further, the surface roughness (Ra) measured by means of a scanning probe microscope was 0.10 μm. The average pitch between a peak on the surface and a neighboring peak was 25 μm and the average depth between the top of the surface curve and the bottom of the curve was 0.6 μm.

EXAMPLE 6

The anti-reflection film prepared in Example 2 (before the embossing process) was subjected to the embossing process of anti glare treatment described in Example 5.

The average reflectance (in the wavelength region of 450 to 650 nm), the haze, and the surface mechanical strength (in terms of pencil grades) of the prepared film were measured, and found 0.35%, 1.5%, and 2H, respectively.

Further, the surface roughness (Ra) measured by means of a scanning probe microscope was 0.10 μm. The average pitch between a peak on the surface and a neighboring peak was 20 μm, and the average depth between the top of the surface curve and the bottom of the curve was 0.5 μm. The contact angle to water was 350.

EXAMPLE 7

Middle, high and low refractive index layers were formed on a hard coating layer in the same manner as in Example 2, except that the thickness of the low refractive index layer was 0.072 μm. A solution of a cross-linkable fluorine polymer was coated on the low refractive index layer to form a protective layer (thickness: 0.02 μm).

The obtained anti-reflection film was subjected to the embossing process of anti-glare treatment described in Example 5.

The average reflectance (in the wavelength region of 450 to 650 nm) and the haze of the prepared film were measured, and found 0.35% and 1.5%, respectively.

Further, the surface roughness (Ra) measured by means of a scanning probe microscope was 0.15 μm. The average pitch between a peak on the surface and a neighboring peak was 30 μm, and the average depth between the top of the surface curve and the bottom of the curve was 0.75 μm. The contact angle to water was 1060.

EXAMPLE 8

The anti-reflection film prepared in Example 7 was attached to a display surface of a liquid crystal display of a personal computer (PC9821NS/340W, Nippon Electric Co., Ltd.). As a result, the phenomenon of displaying a background view on the surface was greatly reduced, and the displayed image was easily observed.

The invention claimed is:

1. A process for the preparation of an anti-reflection film comprising the steps of:
   forming a hard coating layer on a transparent support;
   coating a coating solution on the hard coating layer to form a low refractive index layer having an essentially uniform thickness in the range of 50 to 400 nm and a surface roughness in terms of an arithmetic mean in the range of 0.05 to 2 m, wherein the low refractive index layer comprises inorganic particles, a cross-linked binder polymer and a silane coupling agent, said inorganic particles being surface treated with the silane coupling agent, and said silane coupling agent being combined with the binder polymer by a reaction of a double bond of the silane coupling agent; and then
   embossing the low refractive index layer to form a rough surface on the low refractive index layer, wherein the hard coating layer has an essentially uniform thickness, and the low refractive index layer has an essentially uniform thickness in the range of 50 to 400 nm after embossing the layers, and wherein the cross-linked binder polymer is a polymerization product of a monomer having two or more ethylenically unsaturated groups.

2. The process as defined in claim 1, wherein the low refractive index layer has a refractive index than a refractive index of the support.

3. The process as defined in claim 1, wherein the low refractive index layer has a rough surface such that an area of a roughness curve having a period of 1 to 10 μis more than 15% based on the total area of the rough surface.

4. The process as defined in claim 1, wherein the inorganic particles have a mean particle size of 10 to 100 nm.

5. The process as defined in claim 1, wherein the inorganic particles have a mean particle size of 10 to 40 nm.

6. The process as defined in claim 1, wherein the inorganic particles are so deposited to superpose at least one particle on another particle, to form voids surrounded by the particles.

7. The process as defined in claim 1, wherein a high refractive index layer is further provided between the hard coating layer and the low refractive index layer, said high refractive index layer having a refractive index higher than the refractive index of the support, and said high refractive index layer having an essentially uniform thickness.

8. The process as defined in claim 7, wherein a middle refractive index layer is further provided between the hard coating layer and the high refractive index layer, said middle refractive index layer having a refractive index higher than the refractive index of the support and lower than the refractive index of the high refractive index layer, and said middle refractive index layer having an essentially uniform thickness.

9. The process as defined in claim 1, wherein the inorganic particles are made of a fluoride of an alkali metal, a fluoride of an alkaline earth metal or silicon dioxide.

10. The process as defined in claim 1, wherein the silane coupling agent is represented by the formula (IIa) or (IIb):

wherein each of $R^{11}$ and $R^{15}$ independently is hydrogen or methyl, $R^{16}$ is an alkyl group having 1 to 10 carbon atoms, an aryl group having 1 to 10 carbon atoms, an alkenyl group having 2 to 10 carbon atoms, an alkynyl group having 2 to 10 carbon atoms or an aralkyl group having 7 to 10 carbon atoms, and each of $R^{12}$, $R^{13}$, $R^{14}$, $R^{17}$ and $R^{18}$ independently is an alkyl group having 1 to 6 carbon atoms or an acyl group having 2 to 6 carbon atoms.

* * * * *

UNITED STATES PATENT AND TRADEMARK OFFICE
CERTIFICATE OF CORRECTION

PATENT NO. : 7,108,810 B2 Page 1 of 1
APPLICATION NO. : 10/288508
DATED : September 19, 2006
INVENTOR(S) : Kazuhiro Nakamura et al.

It is certified that error appears in the above-identified patent and that said Letters Patent is hereby corrected as shown below:

Column 18, Line 9: change "2 m" to --2 µm--.

Column 18, Line 28: change "10 µ is" to --10 µm is--.

Signed and Sealed this

Second Day of January, 2007

JON W. DUDAS
*Director of the United States Patent and Trademark Office*